(12) United States Patent
Ngo et al.

(10) Patent No.: US 10,811,236 B2
(45) Date of Patent: Oct. 20, 2020

(54) MAGNETIC ANODE FOR SPUTTER MAGNETRON CATHODE

(71) Applicant: General Plasma Inc., Tucson, AZ (US)

(72) Inventors: Phong Ngo, Tucson, AZ (US); John E. Madocks, Tucson, AZ (US)

(73) Assignee: General Plasma, Inc., Tucson, AZ (US)

( * ) Notice: Subject to any disclaimer, the term of this patent is extended or adjusted under 35 U.S.C. 154(b) by 0 days.

(21) Appl. No.: 15/540,325

(22) PCT Filed: Oct. 26, 2015

(86) PCT No.: PCT/US2015/057407
§ 371 (c)(1),
(2) Date: Jun. 28, 2017

(87) PCT Pub. No.: WO2016/069490
PCT Pub. Date: May 6, 2016

(65) Prior Publication Data
US 2017/0345628 A1 Nov. 30, 2017

Related U.S. Application Data

(60) Provisional application No. 62/069,865, filed on Oct. 29, 2014.

(51) Int. Cl.
*H01J 37/34* (2006.01)
(52) U.S. Cl.
CPC ...... *H01J 37/3423* (2013.01); *H01J 37/3405* (2013.01); *H01J 37/345* (2013.01); *H01J 37/3438* (2013.01); *H01J 37/3452* (2013.01)

(58) Field of Classification Search
CPC .............. H01J 37/3423; H01J 37/3405; H01J 37/3438; H01J 37/345; H01J 37/3452
USPC ..................... 204/298.21, 298.22
See application file for complete search history.

(56) References Cited

U.S. PATENT DOCUMENTS

| | | |
|---|---|---|
| 4,478,702 A | 10/1984 | Gillery et al. |
| 4,600,490 A | 7/1986 | Gillery et al. |
| 4,744,880 A | 5/1988 | Gillery et al. |
| 5,106,474 A * | 4/1992 | Dickey ............... C23C 14/564 |
| | | 204/298.06 |
| 5,407,551 A | 4/1995 | Sieck et al. |
| 5,503,676 A * | 4/1996 | Shufflebotham .. H01J 37/32862 |
| | | 118/719 |

(Continued)

OTHER PUBLICATIONS

International Search Report and Written Opinion dated Feb. 5, 2016, issued in PCT/US2015/057407, 8 pages.

(Continued)

*Primary Examiner* — John J Brayton
(74) *Attorney, Agent, or Firm* — Grossman Tucker Perreault & Pfleger, PLLC

(57) ABSTRACT

A rotary sputter magnetron assembly for use in sputtering target material onto a substrate is provided. The assembly comprises a longitudinally extending target tube having a longitudinal central axis, said target tube extending about a magnet array that is configured to generate a plasma confining magnetic field adjacent the target tube, said target tube supported for rotation about its longitudinal central axis and a pair of side shunts positioned parallel to the longitudinal central axis, and on opposing lengthwise sides of said target tube.

18 Claims, 9 Drawing Sheets

(56) References Cited

U.S. PATENT DOCUMENTS

| | | | |
|---|---|---|---|
| 5,616,225 A | 4/1997 | Sieck et al. | |
| 5,645,699 A | 7/1997 | Sieck | |
| 5,683,558 A | 11/1997 | Sieck et al. | |
| 8,951,394 B2* | 2/2015 | Bernick | C23C 14/35 |
| | | | 204/298.16 |
| 2002/0153103 A1* | 10/2002 | Madocks | C23C 14/352 |
| | | | 156/345.46 |
| 2005/0034981 A1* | 2/2005 | Fuchs | C23C 14/3407 |
| | | | 204/298.21 |
| 2006/0076231 A1* | 4/2006 | Wei | C23C 14/046 |
| | | | 204/192.12 |
| 2007/0026161 A1* | 2/2007 | Madocks | C23C 8/36 |
| | | | 427/569 |
| 2008/0073557 A1* | 3/2008 | German | C23C 14/221 |
| | | | 250/424 |
| 2008/0173535 A1 | 7/2008 | Krempel-Hesse | |
| 2010/0044222 A1 | 2/2010 | Miller et al. | |
| 2010/0155226 A1 | 6/2010 | Madocks et al. | |
| 2012/0261253 A1 | 10/2012 | Madocks et al. | |
| 2013/0213805 A1 | 8/2013 | Hollars | |

OTHER PUBLICATIONS

International Preliminary Report on Patentability dated May 2, 2017, issued in PCT/US2015/057407, 5 pages.

* cited by examiner

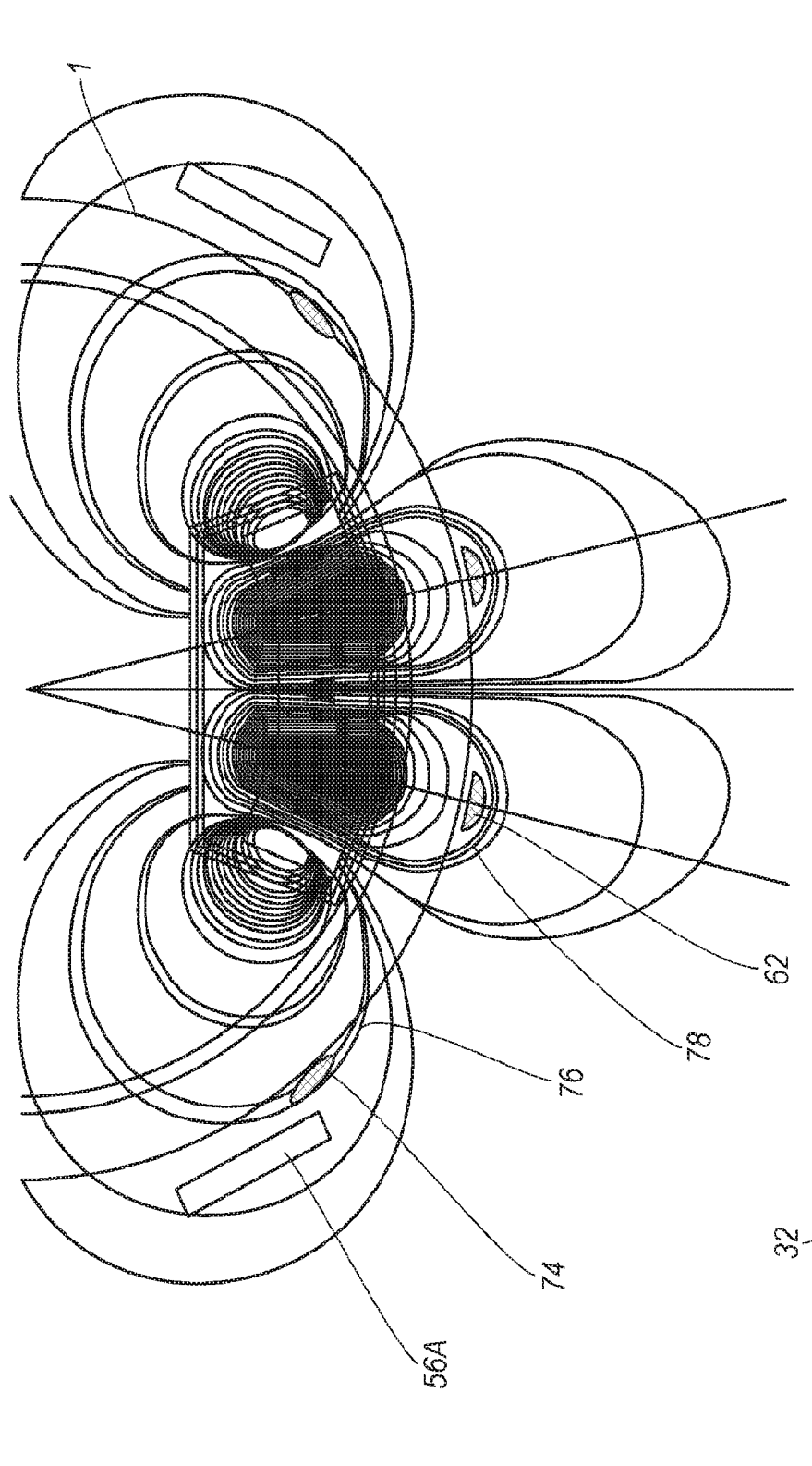

MAGNETIC ANODE FOR SPUTTER MAGNETRON CATHODE

FIELD OF THE INVENTION

The present invention generally relates to magnetron cathode sputter apparatus. More specifically to the sputtering of indium tin oxide (ITO) on large substrates or over large areas.

BRIEF DESCRIPTION OF THE DRAWINGS

FIGS. 4A and 4B show cross section views of magnetic shunts without and with the use of magnetic material.

DESCRIPTION OF THE INVENTION

Indium tin oxide (ITO) is used in many applications because it is both optically clear and electrically conductive. Typically, ITO is deposited by magnetron sputtering. Recently, rotary magnetron ITO targets have become commercially available. Rotary magnetrons have several advantages over planar magnetrons including: Improved target cooling, stable operation, longer production runs and higher power operation. While these advantages are attractive, the desired ITO optical and electrical film properties, achieved with planar magnetron sputtering, have not been matched with existing rotary magnetron magnetic plasma confinement designs.

Figure 8A:
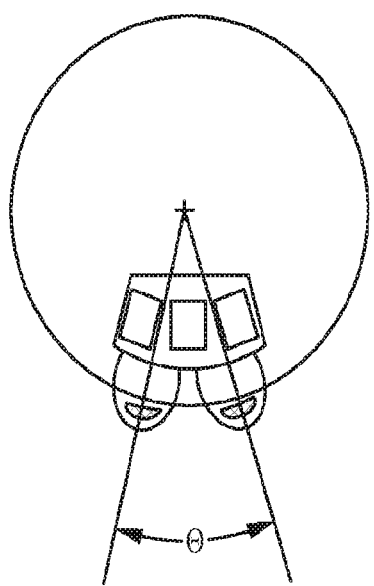
FIGS. 8A and 8B show cross sections of RM's with standard strength magnetic field and high strength magnetic field magnet packs inside the RM target tubes respectively and compares the plasma lobe locations on the outside of the target tubes.
Figure 8B:
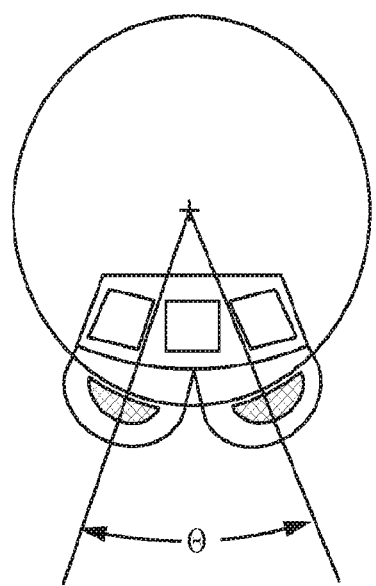

In magnetron sputtering of ITO, the strength of the plasma confinement magnetic field significantly effects film properties. This sensitivity is less pronounced for other materials. In sputtering ITO, a strong magnetic field improves the conductivity of ITO. This is well documented in ITO sputtering with planar magnetrons. A typical planar magnetron magnetic field strength at the target surface might be 250-500 G, improved ITO properties are seen with target surface magnetic fields of 700-1200 G. Therefore, a challenge for rotary magnetron ITO sputtering is to configure the RM to have a strong magnetic field. One solution is to use bigger magnets inside the RM. This works to strengthen the magnetic field, however, because the target tube diameter is set by industry standards and bigger magnets take up more room inside the RM, the racetrack straight-aways are spaced further apart on the target tube OD (Please see FIGS. 8A and 8B). When sputter plasma straight-aways move apart, the sputter flux from the target is directed less at the substrate and more toward the process chamber side walls. Additionally, the flux that does hit the substrate has an angled, longer travel path. This results in a lower particle arrival energy and a loss of film quality. Therefore, an improved RM for sputtering ITO is needed that maintains or improves upon the ITO properties achieved with planar magnetron sputtering.

Figure 1:
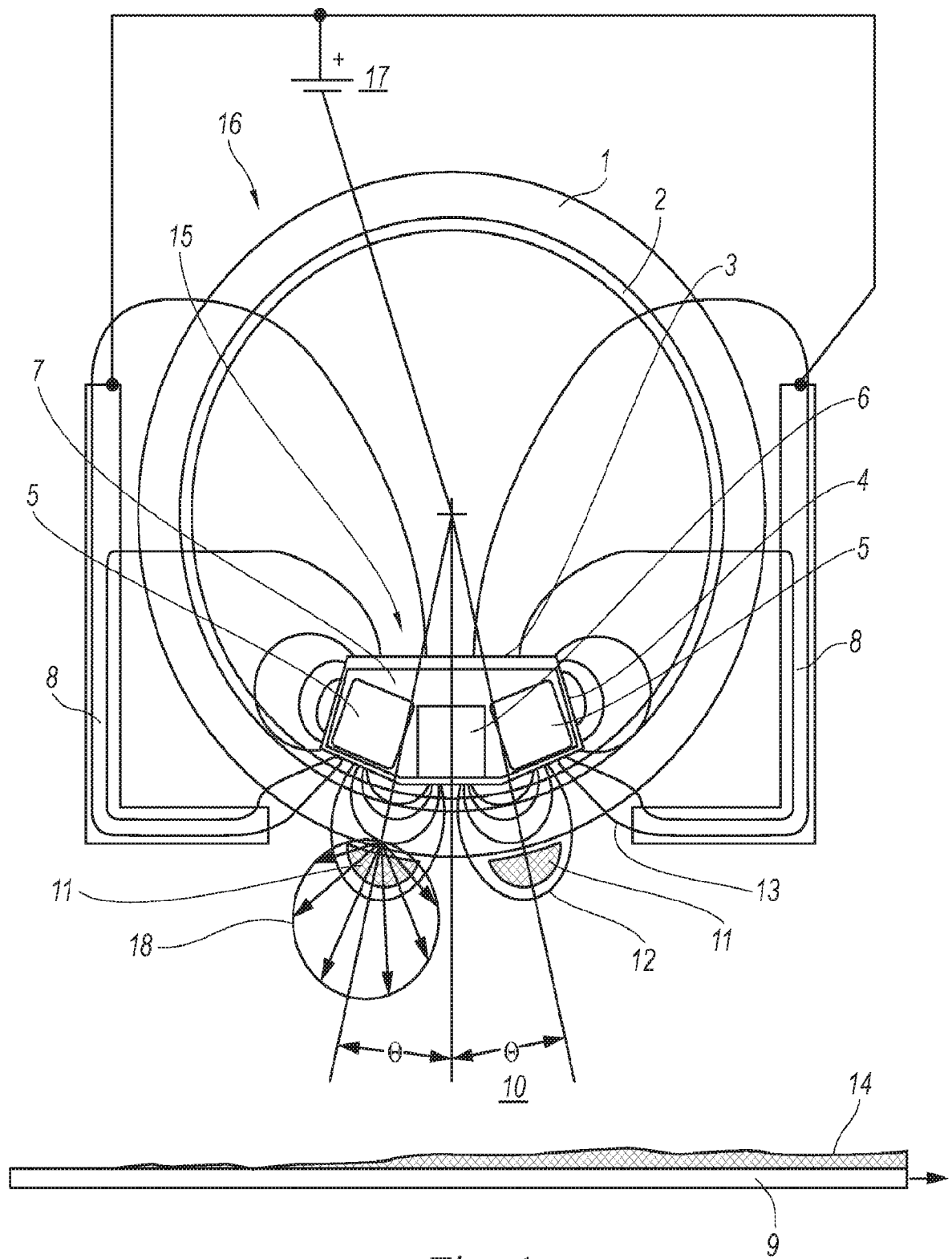
FIG. 1 is a cross section view of a rotary magnetron cathode with a magnetic anode.

FIG. 1 shows a cross section view of an inventive embodiment a rotary magnetron 16 with magnetic anodes 8. Rotary magnetron 16 has a stationary magnet pack 15 positioned inside target back tube 2. Target tube 1 is made of the material to be sputtered onto substrate 9, for instance, ITO. The deposited sputter material 14 grows in thickness on substrate 9 as substrate 9 is moved past rotary magnetron 16. Magnets 5 and 6 and shunt 7 form electron confining racetrack magnetic field lines 12 on the outside of target tube 1 and, when the magnetron is operating, a plasma racetrack 11 is visible. Magnets 5 and 6 and shunt 7 are enclosed in a hermetically sealed pouch 4. Pouch 4 seals out the cooling water filling tube 2 (not shown). As is known in the art, tube 2 with target material 1 rotates continuously during operation. External to target tube 1, magnetic anodes 8 are positioned as shown on both sides of tube 1. The anodes 8 extend along the target tube 1 parallel to the electron confining racetrack 12. In this embodiment of the invention, magnetic anodes 8 are made of mild steel. Other high permeability materials can also be used. Magnetic anodes 8 draw magnetic field lines 13 that otherwise would spread out in the vacuum chamber. Sputtered flux cosine distribution 18 from target tube 1 is depicted on one plasma racetrack 11.

Figure 2:
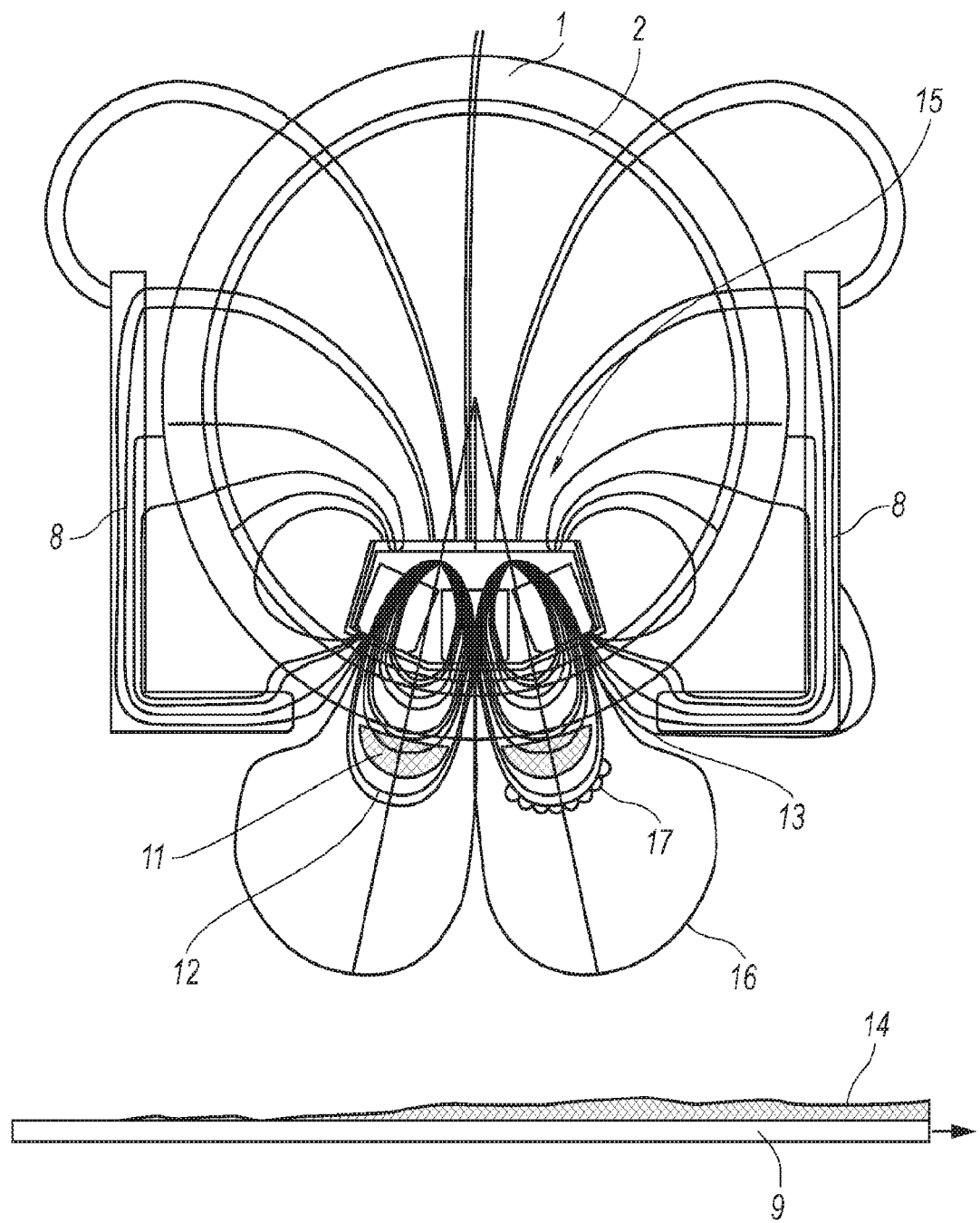
FIG. 2 shows the FIG. 1 section view with magnetic field streamlines.

FIG. 2 shows the same cross section view of a rotary magnetron 16 with magnetic anodes 8 as FIG. 1. In FIG. 2, Additional magnetic field lines 16 are shown to further explain the benefit of magnetic anodes 8. Additionally, the path 17 of an electron as it moves along magnetic field lines is shown.

Figure 3:
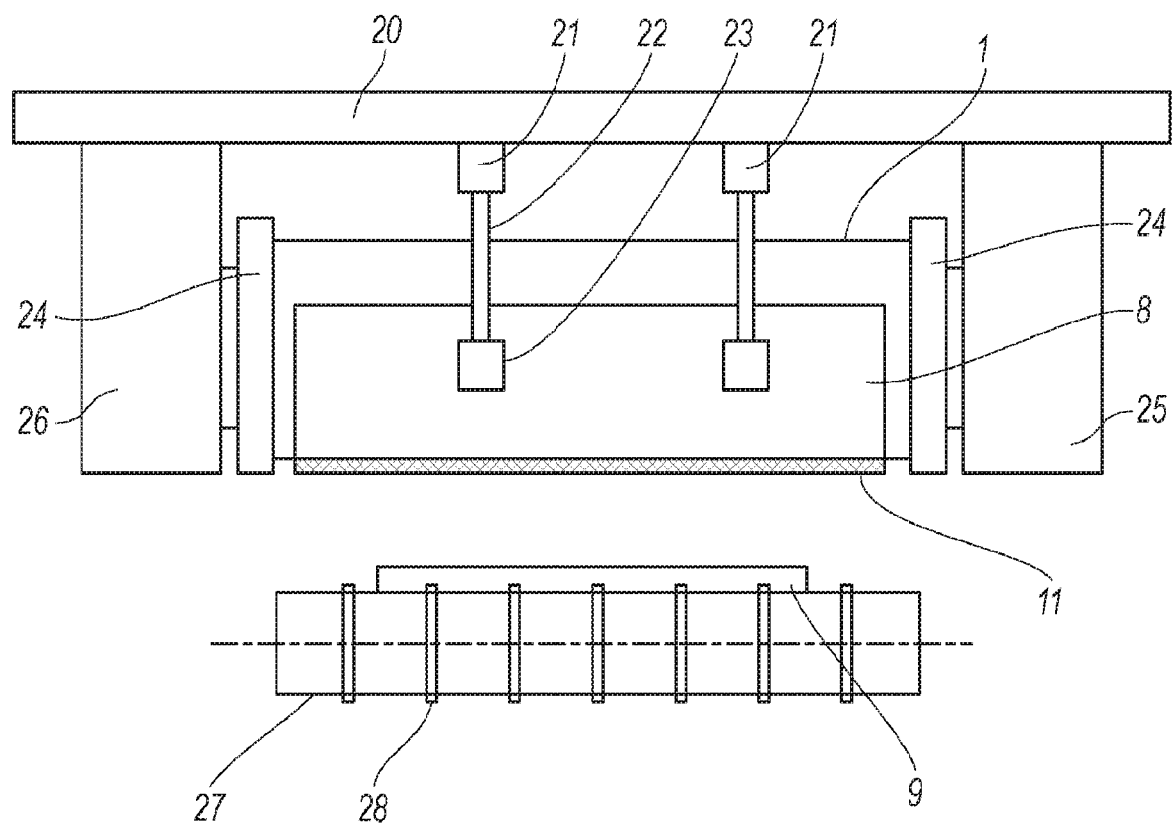
FIGS. 3 is a side view of the rotary magnetron cathode with magnetic anode shown in FIGS. 1 and 2.

FIGS. 3 is a side view of the rotary magnetron with magnetic anodes shown in FIGS. 1 and 2. The rotating target tube 1 is attached by target clamps 24 to end blocks 25 and 26. The end blocks are attached to the chamber lid 20. Support members 21, 22 and 23 attach to the chamber lid and support the magnetic anodes 8 such that anodes 8 remain stationary. These members also electrically isolate anode 8 from target tube 1 and from ground. Substrate 9 is supported by O-rings 28 on rollers 27. As shown in FIG. 3, anodes 8 extend along target tube 1 for nearly the length of tube 1.

The RM with magnetic anodes as shown in FIGS. 1-3 delivers the sought-after properties of sputtered ITO, equaling the performance of planar magnetron sputtered films, while maintaining the advantages of RM sputtering. As shown in FIGS. 1-3, the magnets 5 and 6 inside the magnet pouch 4 are large, producing a magnetic field at the sputter surface of the target tube 1 of >1000 G. In order to keep angle theta small, outer racetrack magnets 5 are the same size as inner magnet 6. Because there are two outer magnets 5 for every inner magnet 6, the magnetic field is unbalanced toward the center. This is termed a Type II unbalanced magnetron configuration according to Windows and Saavides. The stronger outside field pushes the sputter lobes 12 in toward the center and effectively maintains a small theta. In the embodiment shown, theta is 13°. This unbalanced configuration can normally cause a second racetrack to light on the outside of the target tube (see FIGS. 4A and 4B). One purpose of the magnetic anodes is to pull field lines away from the target tube to eliminate the second racetrack from lighting.

The magnetic anodes 8 also enhance deposition uniformity. By locating the anodes close to the plasma racetrack 11, electron flow away from the cathode to the anode can be controlled. If the anodes are further from the plasma lobes 11, magnetic field lines can exist from the magnet pouch 15 to the substrate or to process chamber walls or shields. These 'stray' field lines impede electron flow to the anode and significantly affect deposition uniformity. Locating anodes 8 as shown in FIGS. 1-3, eliminates stray field lines and leaves only field lines that confine the magnetron sputter plasma 11 (including field lines 12 and 16) and field lines 13 that terminate in magnetic anode 8. This is shown in FIG. 2.

In specific inventive embodiments, the primary racetrack plasma magnetic field is approximately 500 to 1200 G, as compared to existing rotary magnetron designs that have magnetic fields of between 250-500 G. The aforementioned magnetic field values are measured at the surface of a 10 mm thick cylindrical target of embodiment of the inventive rotary magnetron. A strong magnetic field lowers the voltage of the plasma discharge making for a more electrically efficient process. In addition, sputtering of certain substances such as indium tin oxide (ITO) is benefitted by a stronger racetrack magnetic field.

Figure 4B:
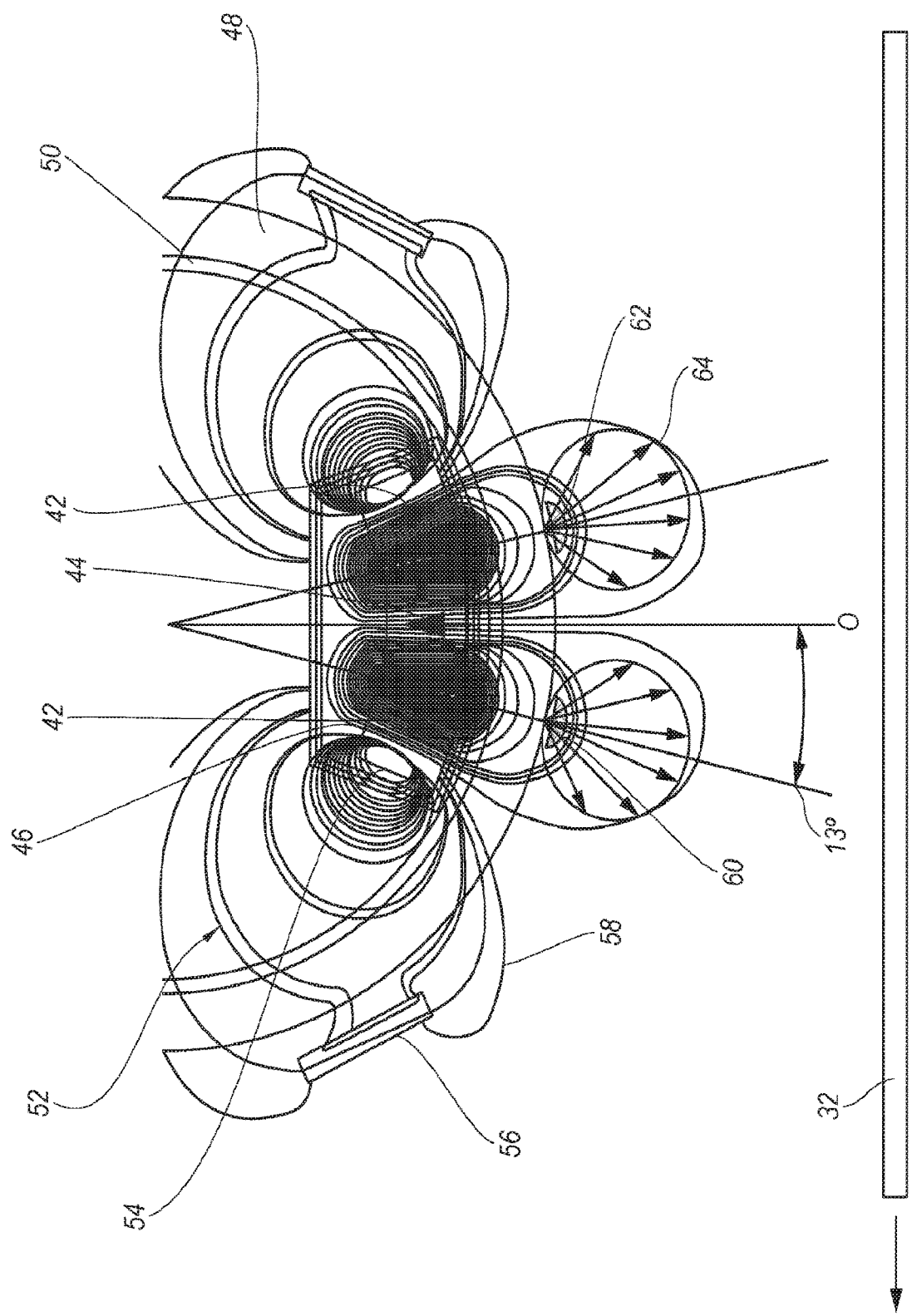

Embodiments of the inventive magnetron increase the strength of the magnetic field without spreading the plasma lobes apart, which as described above is a problem with previous magnetron designs, by increasing the size of the outside magnets relative to the center magnet. The additional outside magnetic field tends to push the racetrack inward toward the center, and is an effective method to keep the primary racetrack separation angle small and between 5 and 20 degrees. By way of example, and angle of 13 degrees is shown in FIG. 4B that promotes on-angle sputter while still allowing large magnets to be used. The difficulty encountered is that all the field lines exiting the larger outer magnets 42 do not pass into the center magnet 44. A significant number of the field lines wrap the opposite direction, and cause the formation of a secondary racetrack plasma 74 as shown in FIG. 4A. The present invention invokes side anodes or shunts 56 to stop this secondary plasma from forming and enable the use of larger outer magnets 42. The end result is a high magnetic field strength primary plasma 60 with a small separation angle between plasma lobes that solves this long standing problem in the field of rotary magnetrons.

Note that the magnetic anodes can be connected as anodes to the plasma power supply or alternately not connected and be electrically floating or grounded. In the case where the anodes are not electrically connected to the power supply, they function as magnetic shunts and as such serve to benefit overall operation as described herein.

A small plasma lobe separation, represented by angle theta and provided present invention, has several benefits. With a small plasma lobe separation, the path length of the sputter flux is reduced for a given target to substrate distance so the number of particle collisions encounter is reduced and the energy of the particles arriving at the substrate is increased. The more direct impact with a smaller separation distance improves the density of the sputtered film on the substrate, compared to more oblique impact angles, while the deposition rate is improved as more sputtered flux hits the substrate rather than the side shields. As a result, less deposition buildup on the side shields occurs and flaking and particle contamination on the substrate is reduced. A reduction of flaking and contamination reduces the frequency of shield cleaning to increase overall efficiency of machine operation. Furthermore, with a more direct sputter flux path, target tubes are used more efficiently as more of the target material is deposited on the substrate, so as to achieve savings on target materials and less frequent changing of the target tubes.

Minimizing the plasma lobe separation angle theta according to the present invention helps to reduce side sputtering and consequently facilitating compact placement of adjacent rotary magnetron target tubes. The side shunts themselves that are employed in embodiments of the inventive rotary magnetron have some functionality to shield one target tube from sputtered flux from an adjacent tube.

In embodiments of the inventive rotary magnetron, the magnetic anodes or side shunts can be electrically floating, grounded or connected to the sputter power supply as the anodes. With or without electrical connection, the anodes/shunts allow an unbalanced (type II) configuration to be implemented with a rotary magnetron cathode. The anodes/shunts should be installed on both sides of a rotary magnetron target tube, since if one side of the target is left open, a secondary plasma can ignite along the length of the target tube on that unshielded side. It has been found that even with the side shunts, a weak closed magnetic field can form close to the target. However, if the weak closed path magnetic field is less than 25% the strength of the primary closed field, a secondary plasma will not ignite. For purposes of measuring the weak closed path magnetic field, this field is measured tangential to the target tube at the target tube surface.

Furthermore at the ends of the rotary target tube, at the turnarounds of the primary plasma, anodes/shunts are not required. Without intending to be bound to a particular theory, because the turnaround region is relatively short in a racetrack configuration, even if a secondary confinement region is created by the magnetic design, the secondary plasma cannot ignite or will be insignificant due to the comparatively small area of this region relative to the racetrack straight sections. With typical sputtering operational parameters, a length of about 300 mm is required before a secondary plasma can build sufficient intensity to be problematic. At a target tube end, as the primary plasma turnaround wraps over the target tube from one side to the other, the plasma length is typically only about 100 mm.

FIG. 4A is a cross-sectional view of an RM with magnetic anodes/shunts except the ferromagnetic shunt 56A material is non-magnetic. This view is intended to illustrate what happens when magnetic material is not used for anode/shunt 56A. As shown, the result is a second plasma 74 lights on the target tube 1.

FIG. 4B is a cross-sectional view of an RM with magnetic anodes/shunts 56. In this view, the anodes are ferromagnetic (mild steel) and as can be seen, the magnetic field lines 58 are pulled to this shunt 56 and secondary plasmas are eliminated. With the side shunts 56, magnetic field lines enter and exit the side shunt rather than close over the target tube. The side shunts are electrically floating, grounded or connected to the anode of the power supply. As such, the side shunts are not at cathode potential and a secondary plasma cannot light.

Figure 5:
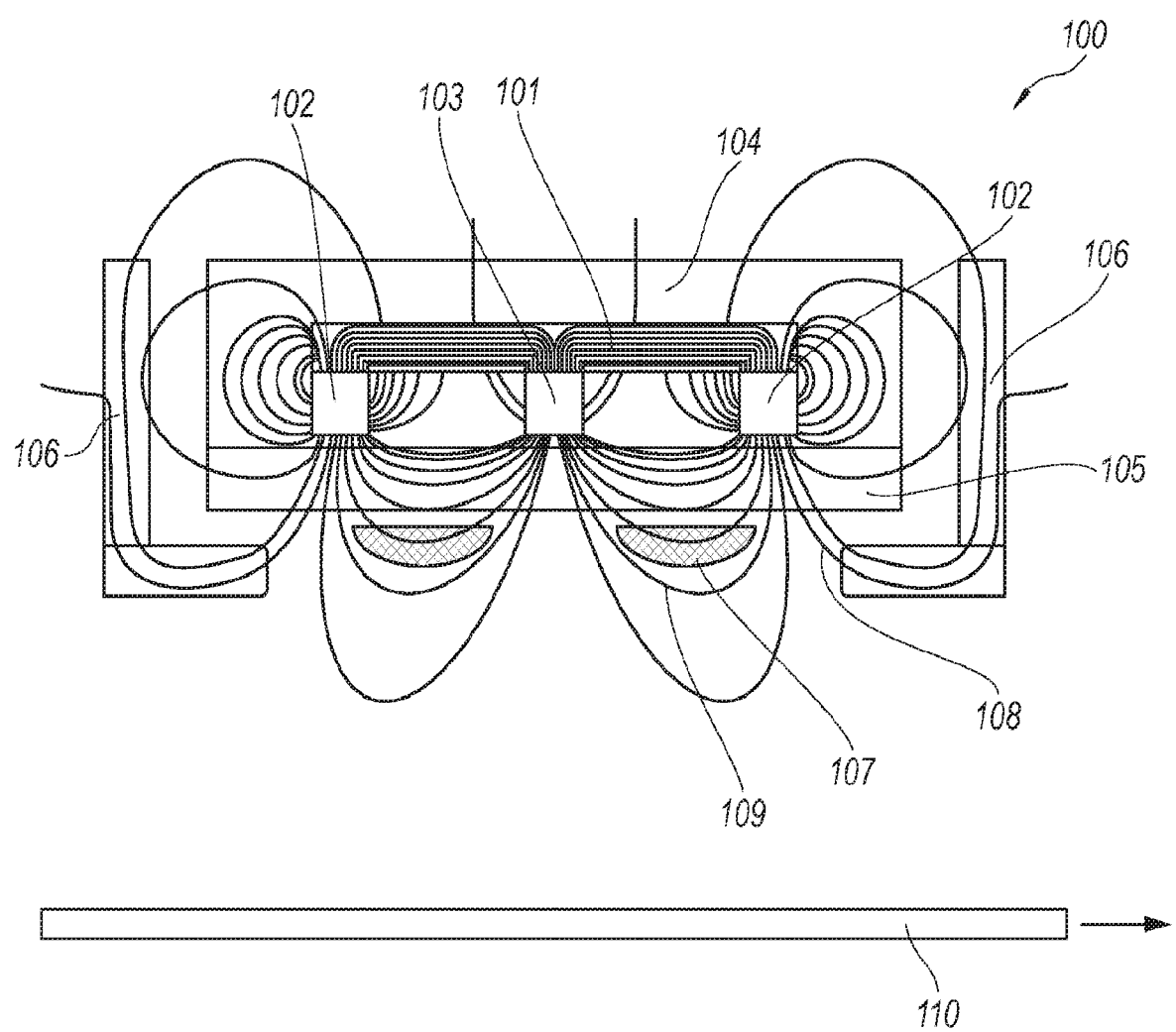
FIG. 5 is a cross section view of a planar magnetron cathode with a magnetic anode.

FIG. 5 is a cross section view of a planar magnetron fitted with magnetic anodes 106. Though primarily intended to improve RM's, magnetic anodes 106 can also be applied to planar magnetrons.

Figure 6:
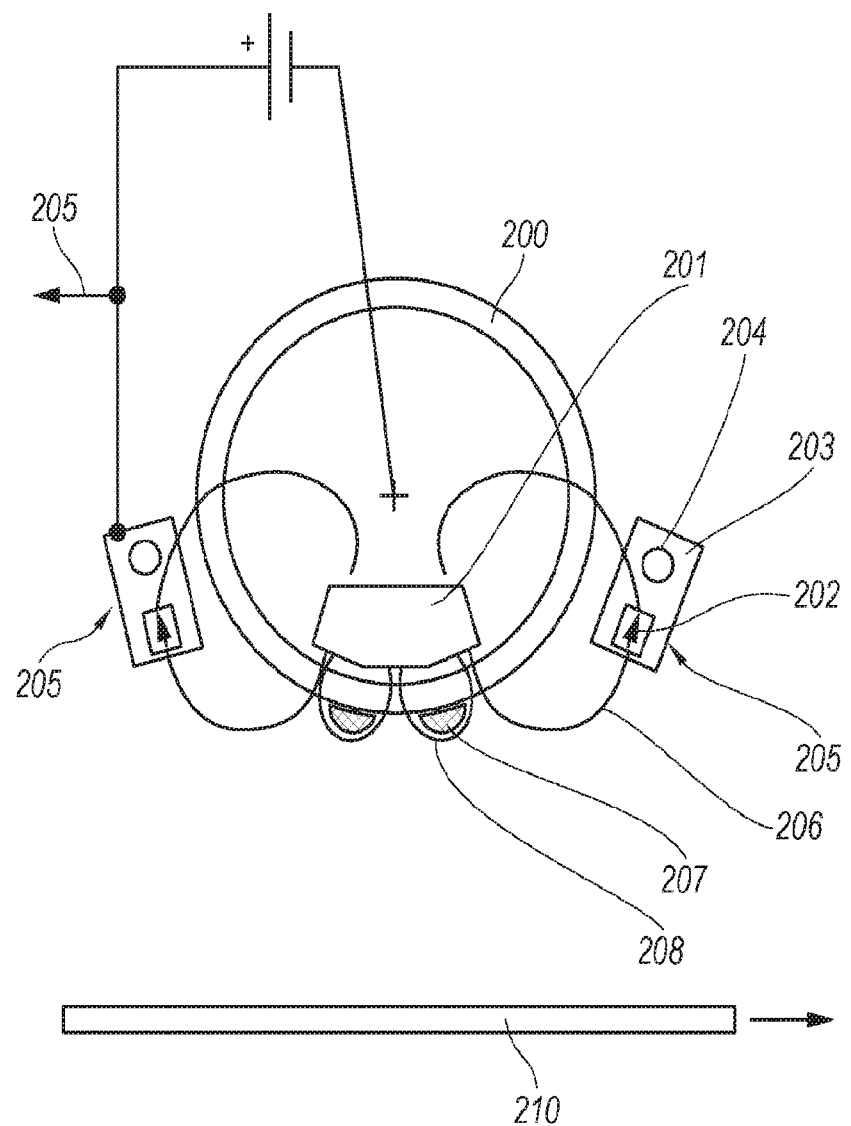
FIG. 6 is a cross section view of a rotary magnetron with magnetic anode where the magnetic anodes have magnets rather than only ferromagnetic material.

FIG. 6 is a cross section view of another embodiment of the invention. In this embodiment. ferromagnetic anodes 8 (from FIGS. 1-3) are replaced by non-magnetic anodes 203 with magnets 202 inside the anodes 203. Due to heating effects, these anodes must be water cooled 204 by known techniques. The use of magnets makes drawing stray magnetic field lines 206 away from the RM magnet pouch 201. This advantage is weighed against the complexity of the anode with magnets vs a simple, one piece ferromagnetic anode.

Figure 7:
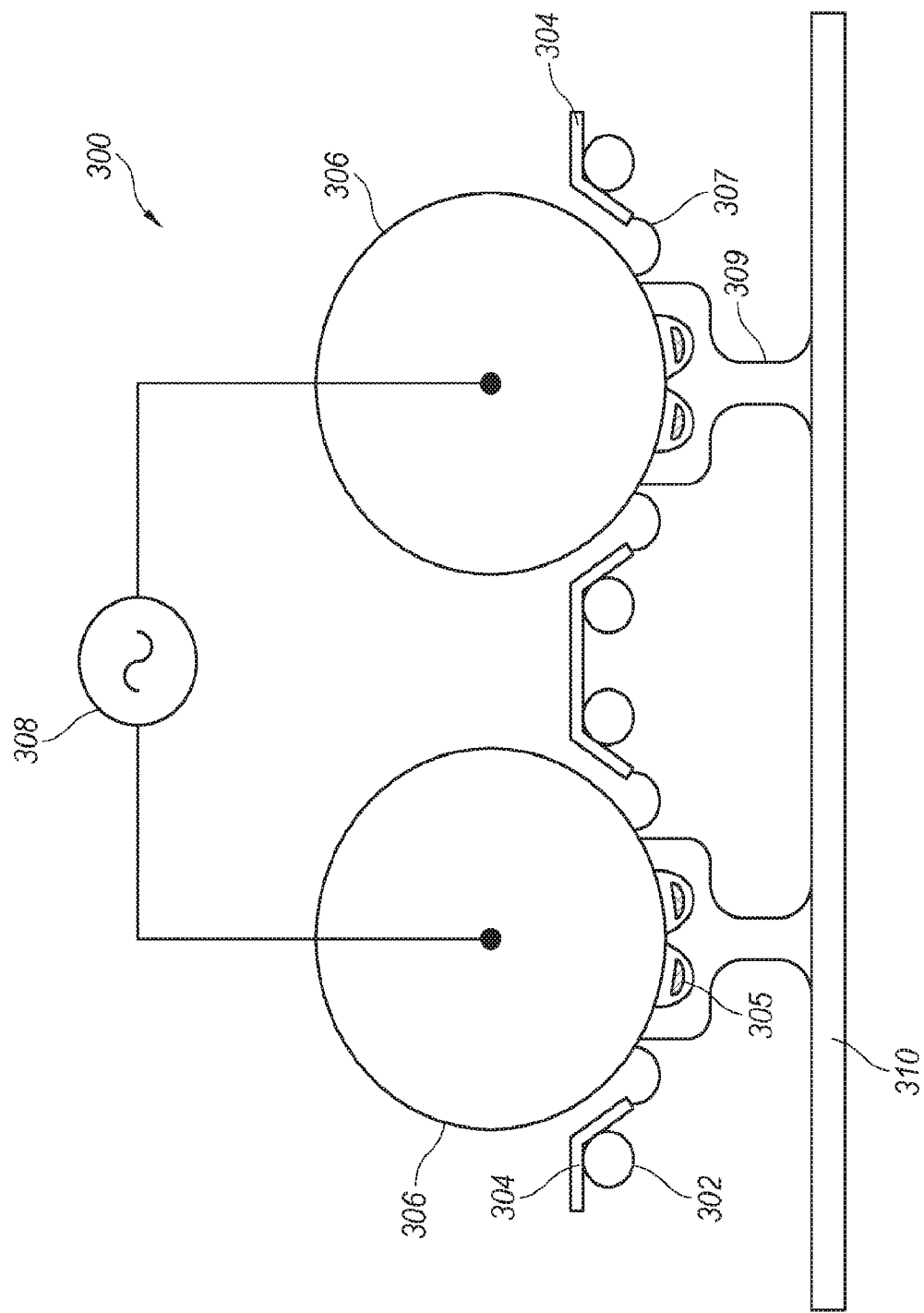
FIG. 7 is a cross section view of rotary magnetrons configured for dual magnetron sputtering with an AC power supply. Magnetic shunts extend along the sides of the target tubes.

FIG. 7 is a cross-sectional view of a configuration 300 for dual rotary magnetrons 306 with an AC power supply 308. In this case, the magnetic anodes/shunts 304 are not connected to the power supply but are simply electrically floating or grounded. In this case, the anodes/shunts are used as magnetic shunts to collect stray magnetic field 307 and prevent second plasma racetracks from lighting on the target tubes 306.

It is appreciated that the dimensions of the side anodes/shunts are determined by the magnetic design of the magnet bar inside the target tube as well as the target material thickness and target tube diameter. The side shunts must effectively pull the magnetic field away from the target tube surface so that the secondary plasma doesn't light and stray magnetic field lines are eliminated. For example in FIGS. 1 through 3, 5 millimeter (5 mm) thick side shunts are shown. These side shunts are sufficiently thick to pull the required magnetic field without becoming saturated. If the shunts are too thin, they are magnetically saturated and become less effective. It is further appreciated that the minimum thickness is also dependent upon the side shunt material. For low cost and sufficient performance, mild steel side shunts may be used in the FIGS. 1-3. In FIGS. 1-3, the base tube 2 is 133 mm OD by 125 mm ID (the most common standard tube size). The target tube 1 material thickness may be from 2 to 30 mm. Due to the expense, indium tin oxide (ITO) target tubes 1 are typically thinner, 10 mm thick.

While the present invention has particular advantages in the sputter deposition of ITO coatings, this should not limit the target materials that can be used nor the scope of the invention.

The foregoing description is illustrative of particular embodiments of the invention, but is not meant to be a limitation upon the practice thereof. The following claims, including all equivalents thereof, are intended to define the scope of the invention.

What is claimed is:

1. A rotary sputter magnetron assembly for use in sputtering target material onto a substrate, the assembly comprising:
    a longitudinally extending target tube having a longitudinal central axis, an inward facing side, and an outward facing side, said target tube extending about a magnet array that is configured to generate a primary racetrack magnetic field adjacent the target tube, said target tube supported for rotation about its longitudinal central axis;
    a pair of magnetic side shunts positioned parallel to the longitudinal central axis, wherein the magnetic side shunts are disposed outside the target tube, on opposing lengthwise sides of said target tube, and proximate said outward facing side; and
    a power supply;
    wherein:
    each of said magnetic side shunts is electrically grounded or is electrically coupled to the power supply as an anode; and
    the primary racetrack magnetic field has a primary racetrack separation angle less than or equal to about 20 degrees.

2. The rotary sputter magnetron assembly of claim 1, wherein each of said magnetic side shunts is electrically grounded.

3. The rotary sputter magnetron assembly of claim 1, wherein each of said magnetic side shunts is electrically coupled to the power supply as an anode.

4. The rotary sputter magnetron assembly of claim 1, wherein the outside surface of the target tube has a first length, and each of the magnetic side shunts extends parallel to the longitudinal central axis along the outside surface for substantially all of the first length.

5. The rotary sputter magnetron assembly of claim 1, wherein the pair of magnetic side shunts are configured and positioned relative to the target tube to prevent secondary plasma racetracks from lighting on the target tube.

6. The rotary sputter magnetron assembly of claim 1, wherein the primary racetrack magnetic field has a field strength greater than 1000 Gauss.

7. The rotary sputter magnetron assembly of claim 1, wherein the primary racetrack magnetic field has a field strength in a range of about 500 to about 1200 Gauss.

8. A rotary sputter magnetron assembly for use in sputtering target material onto a substrate, the assembly comprising:
    a longitudinally extending target tube having a longitudinal central axis, said target tube supported for rotation about its longitudinal central axis;
    a magnet array inside said target tube that is configured to generate a primary racetrack magnetic field adjacent to said target tube, the primary racetrack magnetic field having a primary racetrack separation angle less than or equal to about 20 degrees; and
    a pair of side shunts positioned outside of said target tube wherein:
    each of the side shunts are parallel to the longitudinal central axis and on opposing lengthwise sides of said target tube;
    each of said side shunts comprise ferromagnetic material;
    each of said side shunts is electrically grounded or is electrically coupled to a power supply of the assembly as an anode.

9. The rotary sputter magnetron assembly of claim 8, wherein an outside of the target tube has a first length, and each of the side shunts extends parallel to the longitudinal central axis along the outside of the target tube for substantially all of the first length.

10. The rotary sputter magnetron assembly of claim 8, wherein:
    said primary racetrack magnetic field has a field strength in a range of about 500 to about 1200 Gauss.

11. The rotary sputter magnetron assembly of claim 8, wherein each of said side shunts is electrically grounded.

12. The rotary sputter magnetron assembly of claim 8, wherein each of said side shunts is electrically coupled to the power supply as an anode.

13. The rotary sputter magnetron assembly of claim 8, wherein the primary racetrack magnetic field has a field strength greater than 1000 Gauss.

14. The rotary sputter magnetron assembly of claim 8, wherein the pair of side shunts are configured and positioned relative to the target tube to prevent secondary plasma racetracks from lighting on the target tube.

15. The rotary sputter magnetron assembly of claim 1, wherein the primary racetrack separation angle is in a range of 5 to 20 degrees.

16. The rotary sputter magnetron assembly of claim 1, wherein the primary racetrack separation angle is in a range of 5 to 13 degrees.

17. The rotary sputter magnetron assembly of claim 10, wherein the primary racetrack separation angle is in a range of 5 to 20 degrees.

18. The rotary sputter magnetron assembly of claim 10, wherein the primary racetrack separation angle is in a range of 5 to 13 degrees.

* * * * *

UNITED STATES PATENT AND TRADEMARK OFFICE
CERTIFICATE OF CORRECTION

PATENT NO. : 10,811,236 B2
APPLICATION NO. : 15/540325
DATED : October 20, 2020
INVENTOR(S) : Phong Ngo et al.

It is certified that error appears in the above-identified patent and that said Letters Patent is hereby corrected as shown below:

In the Claims

In Column 7, Line 4, Claim 17, delete "10" and insert -- 8 --, therefor.

In Column 7, Line 7, Claim 18, delete "10" and insert -- 8 --, therefor.

Signed and Sealed this
Twenty-second Day of December, 2020

Andrei Iancu
*Director of the United States Patent and Trademark Office*